(12) United States Patent
Kobayashi et al.

(10) Patent No.: US 7,692,233 B2
(45) Date of Patent: Apr. 6, 2010

(54) SEMICONDUCTOR DEVICE AND MANUFACTURING METHOD THEREOF

(75) Inventors: Takashi Kobayashi, Higashimurayama (JP); Toshiyuki Mine, Fussa (JP)

(73) Assignee: Renesas Technology Corp., Tokyo (JP)

( * ) Notice: Subject to any disclaimer, the term of this patent is extended or adjusted under 35 U.S.C. 154(b) by 515 days.

(21) Appl. No.: 11/446,220

(22) Filed: Jun. 5, 2006

(65) Prior Publication Data

US 2006/0273374 A1 Dec. 7, 2006

(30) Foreign Application Priority Data

Jun. 6, 2005 (JP) ............................. 2005-165854

(51) Int. Cl.
*H01L 29/788* (2006.01)

(52) U.S. Cl. ..................................... 257/315

(58) Field of Classification Search ......... 257/314–326, 257/E27.078, E29.3–E29.309, E21.179–E21.182, 257/E21.209–E21.21, E21.422, E21.679–E21.694, 257/261, 639, 649, E21.18, E21.423, E29.129, 257/411, 640, E21.267, 760; 438/201, 211, 438/257, 593

See application file for complete search history.

(56) References Cited

U.S. PATENT DOCUMENTS

| | | | |
|---|---|---|---|
| 5,043,940 A | 8/1991 | Harari | |
| 5,907,183 A * | 5/1999 | Takeuchi | 257/640 |
| 6,438,028 B1 | 8/2002 | Kobayashi et al. | |
| 2004/0185647 A1* | 9/2004 | Dong et al. | 438/585 |
| 2004/0209426 A1* | 10/2004 | Nuttall et al. | 438/261 |
| 2006/0017092 A1* | 1/2006 | Dong et al. | 257/314 |
| 2006/0163642 A1* | 7/2006 | Widdershoven et al. | 257/315 |
| 2006/0270157 A1* | 11/2006 | Joo | 438/257 |

FOREIGN PATENT DOCUMENTS

| | | | |
|---|---|---|---|
| JP | 02-110981 A | | 4/1990 |
| JP | 05-190862 A | | 7/1993 |
| JP | 2001-015619 A | | 1/2001 |
| JP | 2001-028428 A | | 1/2001 |
| WO | WO 2004/038728 | * | 6/2004 |
| WO | WO2004/038728 | * | 6/2004 |

* cited by examiner

*Primary Examiner*—Dao H Nguyen
*Assistant Examiner*—Tram H Nguyen
(74) *Attorney, Agent, or Firm*—Miles & Stockbridge P.C.

(57) ABSTRACT

A technology capable of improving a charge retention characteristic of a nonvolatile memory is provided. In a memory cell in which an interlayer insulating film formed of an ONO film obtained by laminating a lower silicon oxide film, a silicon nitride film, and an upper silicon oxide film is formed between a floating gate formed of a polycrystalline silicon film and a control gate formed of a polycrystalline silicon film, the upper silicon oxide film is formed through LPCVD and is then nitrided through a remote plasma process, thereby introducing nitrogen of, for example, 5 to 6 atom % into the upper surface portion of the upper silicon oxide film.

19 Claims, 18 Drawing Sheets

SEMICONDUCTOR DEVICE AND MANUFACTURING METHOD THEREOF

CROSS-REFERENCE TO RELATED APPLICATION

The present application claims priority from Japanese Patent Application No. JP 2005-165854 filed on Jun. 6, 2005 the content of which is hereby incorporated by reference into this application.

TECHNICAL FIELD OF THE INVENTION

The present invention relates to a semiconductor device and a manufacturing technology thereof. More particularly, it relates to a technology effectively applied to a nonvolatile semiconductor memory device having a nonvolatile memory cell and manufacture of such a nonvolatile semiconductor memory device.

BACKGROUND OF THE INVENTION

The flash memory which is a typical nonvolatile semiconductor memory device is excellent in portability and shock resistance, and can perform a bulk erase. Thus, demands for flash memory as a file memory for small-sized portable information devices have been rapidly growing. In general, a flash memory is configured by disposing a plurality of memory cells in a matrix form, in which each of the memory cells has a field-effect transistor as one storage unit, and the field-effect transistor includes a silicon substrate having source and drain diffusion layers, a floating gate and a control gate formed on this silicon substrate and mainly made of a polycrystalline silicon film, an interlayer insulating film for separating these gates, and a tunnel insulating film for separating the floating gate and the silicon substrate.

Also, a memory cell including, in addition to the floating gate and the control gate, a third gate (hereinafter referred to as an assist gate) formed of a polycrystalline silicon film and having functions as a device isolation between memory cells and a write gate or an erase gate, and an interlayer insulating film for separating the floating gate and the assist gate has been reported. In such memory cells, a positive voltage is applied to a control gate on the substrate to inject electrons into the floating gate, and information of "0" or "1" is determined from a difference in threshold voltages.

Initially, as the interlayer insulating film for separating the floating gate and the control gate, a silicon oxide film formed by thermally oxidizing a polycrystalline silicon film forming the floating gate has been used. However, this silicon oxide film has a dielectric withstand voltage lower than that of a silicon oxide film formed on the silicon substrate through a thermal oxidation process, and when applied to a flash memory, it becomes one of the factors to deteriorate a charge retention characteristic. For its solution, in 4 megabits and following flash memories, a multi-layer film having a silicon nitride film vertically interposed between silicon oxide films (hereinafter referred to as an ONO film) has been used.

For example, a method of manufacturing a nonvolatile semiconductor memory device is disclosed in Japanese Patent Application Laid-Open Publication No. 2001-15619 (Patent Document 1), in which a silicon oxide film is formed on a floating gate through CVD, a nitride layer is formed by introducing nitrogen near an interface between the floating gate and the silicon oxide film, a silicon nitride film is formed on the silicon oxide film through low pressure CVD, and a control gate is formed on the silicon nitride film.

Also, for the interlayer insulating film for separating the floating gate and the assist gate, various insulating films have been suggested. For example, a read-only memory transistor is disclosed in Japanese Patent Application Laid-Open Publication No. 2-110981 (Patent Document 2), in which the interlayer insulating film is composed of a silicon oxide film formed through thermal oxidation of a polycrystalline silicon film. Moreover, a semiconductor integrated circuit device and its manufacturing method are disclosed in Japanese Patent Application Laid-Open Publication No. 2001-28428 (Patent Document 3), in which the interlayer insulating film is composed of a silicon oxide film to which nitrogen is added. Furthermore, a method of manufacturing a nonvolatile semiconductor memory device is disclosed in Japanese Patent Application Laid-Open Publication No. 5-190862 (Patent Document 4), in which a nitride film, an oxide film, and a nitride film are laminated on a sidewall of a select gate electrode to form a nitride-film sidewall insulating film, and then a floating gate electrode is formed on the nitride-film sidewall insulating film.

SUMMARY OF THE INVENTION

The inventors of the present invention have studied the case where an ONO film having a silicon nitride film vertically interposed between silicon oxide films is employed as an interlayer insulating film for separating a floating gate and a control gate. The study has revealed that, with the increase in integration of a flash memory, there are various technical problems in the interlayer insulating film for separating a floating gate and a control gate to be described below.

A first technical problem is an increase in process temperature. A high temperature of 900° C. or higher is required to form a silicon oxide film on a silicon nitride film through a thermal oxidation process. Therefore, when an interlayer insulating film is formed after forming source and drain diffusion layers, it is difficult to form a shallow junction, which is indispensable to microfabrication of elements, which is one of factors to interfere with the increase in integration of a flash memory.

A second technical problem is a decrease in reliability due to a thickness reduction of an ONO film. A voltage Vfg applied to the floating gate at the time of rewrite operation of the flash memory is given by the following Equation (1).

$$Vfg = C2 \times Vcg / (C1 + C2) \qquad \text{Equation (1)}$$

In this case, Vcg is a voltage applied to the control gate, and C1 and C2 are a capacitance of the tunnel insulating film and a capacitance of the interlayer insulating film, respectively. To efficiently transfer the voltage applied to the control gate to the floating gate to reduce a program voltage, it is effective to increase C2, that is, to reduce the thickness of the interlayer insulating film. However, if the thickness of top and bottom silicon oxide films of the conventional ONO film is 5 nm or smaller, a problem that charges accumulated in the floating gate are leaked to the control gate arises, that is, a so-called retention failure is observed. Also, when a silicon oxide film for a top layer with a thickness of 5 nm is to be formed, a silicon nitride film of about 10 nm has to be deposited in order to prevent the oxidation of the polycrystalline silicon film which forms the floating gate. For this reason, the reduction in thickness of the ONO film has a limitation of about 15 nm.

Note that there is also a technology for depositing a silicon oxide film at a temperature of about 750° C. through Low Pressure Chemical Vapor Deposition (LPCVD) instead of the thermal oxidation process. However, the silicon oxide film formed through LPCVD has a structural defect called E' center to be a leakage path, which makes it difficult to reduce the thickness of the silicon oxide films serving as the top layer and the bottom layer.

Furthermore, the inventors of the present invention have also studied an interlayer insulating film for separating a floating gate and an assist gate. The study has revealed that, with the increase in integration of a flash memory, there are various technical problems to be described below.

In a memory cell array provided with an assist gate, an inversion layer formed by applying a voltage to the assist gate is used as a local bit line. Since the inversion layer is formed only in an extremely shallow region just below the assist gate, the spread of the local bit line in a lateral direction can be controlled. Therefore, a bit-line pitch can be 2F (F: minimum process dimension). However, an interlayer insulating film between a floating gate and an assist gate is formed by patterning a silicon oxide film deposited through LPCVD into a sidewall shape, and a structural defect (E' center) is included in the silicon oxide film as described above. Moreover, in such a memory cell, since a voltage of about 8 V is applied to the assist gate at the time of writing, a high electric field is applied to the interlayer insulating film between the floating gate and the assist gate along with the development of microfabrication of the memory cell. Consequently, when the thickness of the interlayer insulating film between the floating gate and the assist gate is to be reduced, a leakage current has to be appropriately controlled. If the leakage current is increased, a disturbance phenomenon may occur in a memory cell on an unselected word line and on a selected bit line, i.e, a threshold voltage of the memory cell in a write state is decreased.

An object of the present invention is to provide a technology capable of improving a charge retention characteristic of a nonvolatile memory cell.

Another object of the present invention is to provide a technology capable of improving a disturbance resistance of a nonvolatile memory cell.

The above and other objects and novel characteristics of the present invention will be apparent from the description of this specification and the accompanying drawings.

The typical ones of the inventions disclosed in this application will be briefly described as follows.

A semiconductor device according to the present invention includes: a first gate formed on a first silicon oxide film on a main surface of a substrate; and a second gate formed on a second silicon oxide film on the first gate, wherein a nitrogen concentration of an upper surface portion of the second silicon oxide film in contact with the second gate is higher than a nitrogen concentration of a lower surface portion of the second silicon oxide film in contact with the first gate.

A manufacturing method of a semiconductor device according to the present invention includes the steps of: forming a first gate by depositing a first polycrystalline silicon film on a main surface of a substrate and patterning the first polycrystalline silicon film; after forming a silicon oxide film on the main surface of the substrate through chemical vapor deposition, introducing nitrogen in an upper surface portion of the silicon oxide film through a remote plasma process; and forming a second gate by depositing a second polycrystalline silicon film on the main surface of the substrate and patterning the second polycrystalline silicon film.

The effects obtained by typical aspects of the present invention will be briefly described below.

In a nonvolatile memory cell, a leakage current between the floating gate and the control gate can be reduced. Therefore, it is possible to improve a charge retention characteristic of the memory cell. Also, since the thickness of the interlayer insulating film between the floating gate and the control gate can be reduced, it is possible to decrease an operating voltage at the time of write and erase operations. Furthermore, in a nonvolatile memory cell including an assist gate in addition to the floating gate and the control gate, a leakage current between the floating gate and the assist gate can be reduced. Therefore, it is possible to improve a disturbance resistance of the memory cell.

BRIEF DESCRIPTIONS OF THE DRAWINGS

Figure 17A:
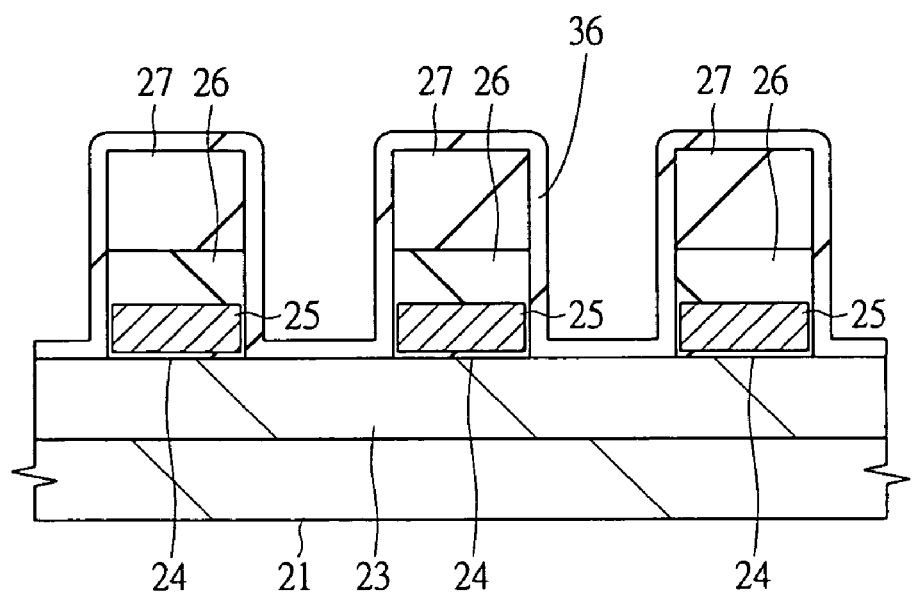
FIG. 17A is a cross-sectional view of main parts of a semiconductor substrate for describing a manufacturing process of a memory cell of an AG-AND flash memory according to a fifth embodiment of the present invention.
Figure 17B:
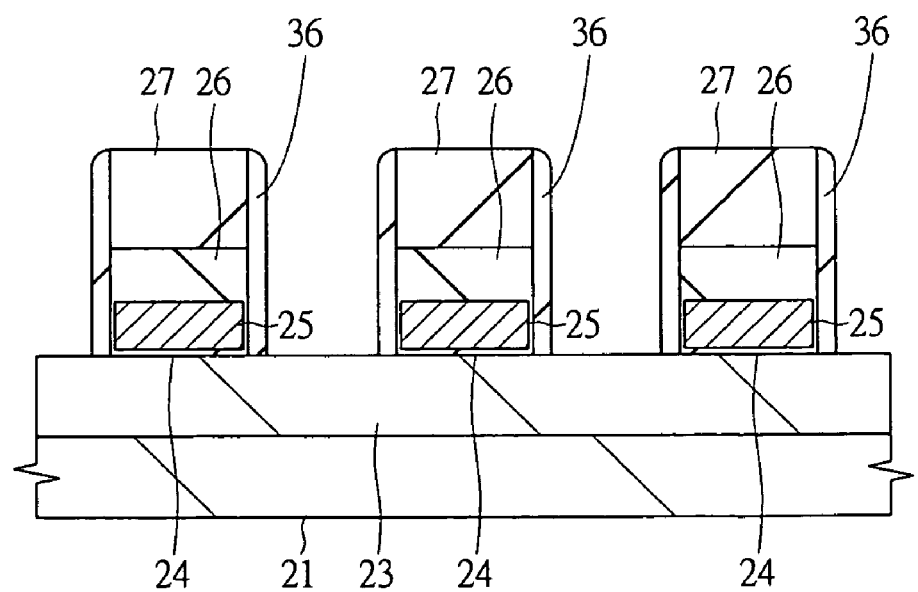
Figure 18:
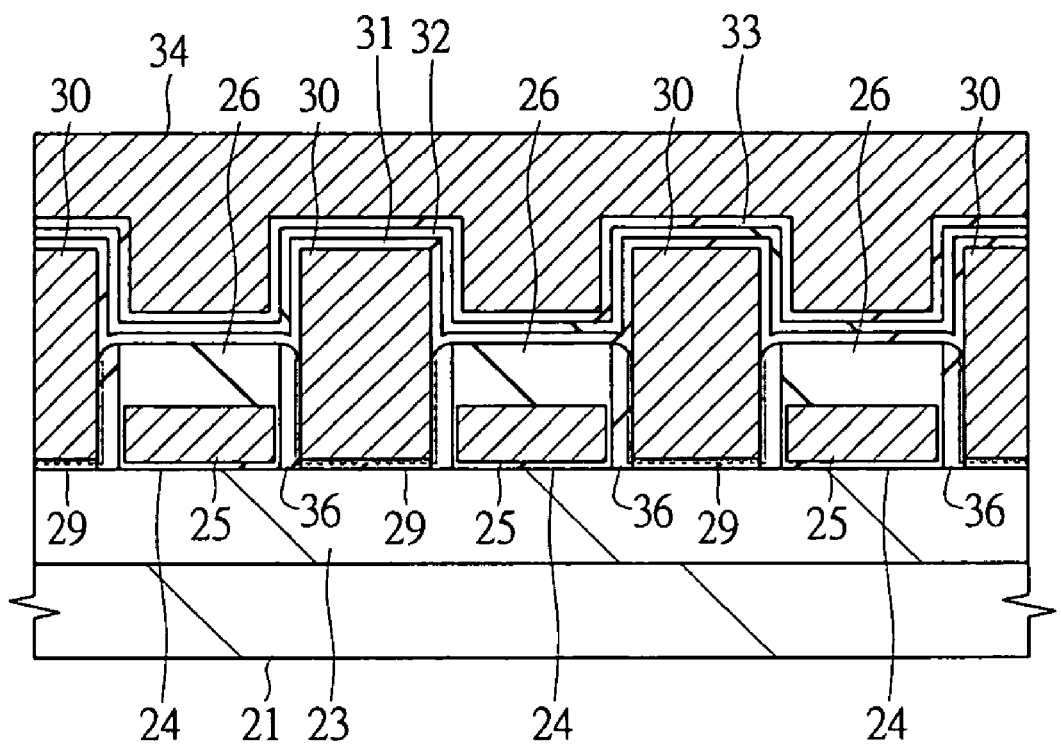

FIG. 17B is a cross-sectional view of main parts of the semiconductor substrate for describing the manufacturing process of a memory cell of the AG-AND flash memory according to the fifth embodiment of the present invention; and FIG. 18 is a cross-sectional view of main parts of the semiconductor substrate for describing the manufacturing process of a memory cell of the AG-AND flash memory according to the fifth embodiment of the present invention.

DESCRIPTIONS OF THE PREFERRED EMBODIMENTS

Hereinafter, embodiments of the present invention will be described in detail with reference to the accompanying drawings. Note that, in the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Note that components having the same function are denoted by the same reference symbols throughout the drawings for describing the embodiment, and the repetitive description thereof will be omitted.

First Embodiment

In the first embodiment, an exemplary case will be described in which an interlayer insulating film between a floating gate and a control gate in a nonvolatile memory cell is formed of an ONO film, and nitrogen is added to an upper surface portion (a surface in contact with the control gate) of an upper silicon oxide film of the ONO film, thereby improving a charge retention characteristic.

Figure 1:
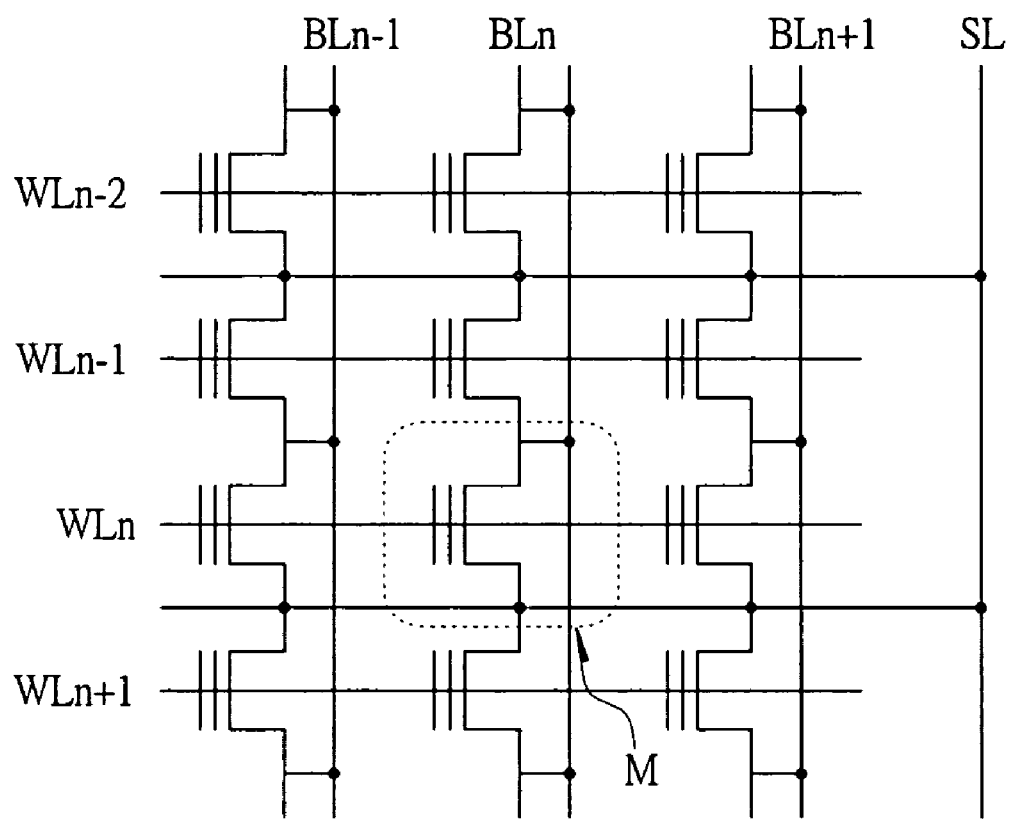
FIG. 1 is a drawing of an equivalent circuit of a memory array of a NOR flash memory according to a first embodiment of the present invention.

A nonvolatile semiconductor memory device in the first embodiment is a so-called NOR flash memory. FIG. 1 is a drawing of an equivalent circuit of a memory cell array.

At the time of writing, for example, a positive voltage of about 12 V is applied to a selected word line WLn of a selected cell M, and a positive voltage of about 5 V is applied to a selected bit line BLn connected to a drain of the selected cell M. A source line SL connected to a source of the selected cell M, wells, unselected word lines WLn−2, WLn−1, and WLn+1 other than the selected word line WLn, and unselected bit lines BLn−1 and BLn+1 other than the selected bit line BLn are held at 0 V. By this means, hot electron injection occurs at the drain end of the selected cell M, and electrons are accumulated in a floating gate, thereby increasing a threshold voltage of the selected cell M. In this manner, writing is performed.

At the time of erasing, for example, a negative voltage of −10 V is applied to the selected word line WLn, and a positive voltage of about 5 V is applied to the source line SL. All of the bit lines BLn−1, BLn, and BLn+1, the wells, and the unselected word lines WLn−2, WLn−1, and WLn+1 are held at 0 V. By this means, in all of the memory cells on the selected word line WLn, electrons are emitted from the floating gate to the source due to the Fowler-Nordheim tunneling phenomenon, thereby decreasing the threshold voltage of the memory cell. In this manner, erasing is performed.

Next, a method of manufacturing a nonvolatile memory cell according to the first embodiment will be described in order of process steps with reference to FIG. 2 to FIG. 6. FIG. 2A to 5A are cross-sectional views of main parts taken along a gate width direction of the floating gate, and FIG. 5B to FIG. 6B are cross-sectional views of the main parts taken along a gate length direction of the floating gate.

Figure 2A:
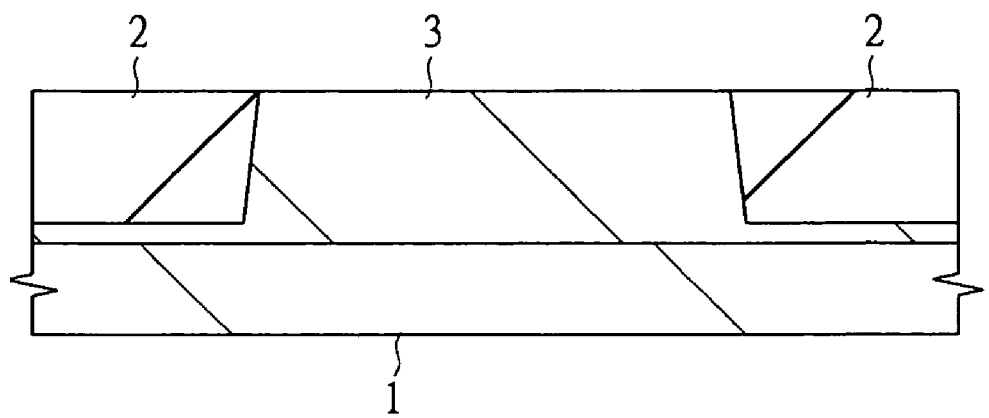
FIG. 2A is a cross-sectional view of main parts of a semiconductor substrate for describing a manufacturing process of a memory cell of the NOR flash memory according to the first embodiment of the present invention.

First, as shown in FIG. 2A, shallow device isolation regions 2 are formed in a main surface of a substrate 1 made of p type single-crystal silicon with (100) orientation. Then, a well 3 is formed through ion implantation and heat treatment.

Figure 2B:
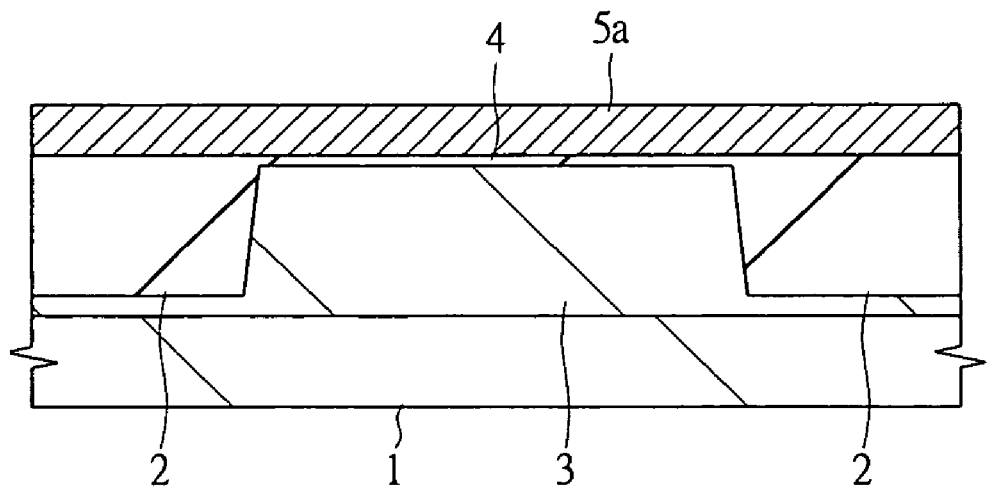
FIG. 2B is a cross-sectional view of main parts of the semiconductor substrate for describing the manufacturing process of a memory cell of the NOR flash memory according to the first embodiment of the present invention.

Next, as shown in FIG. 2B, a silicon oxide film 4 to be a tunnel insulating film is formed on the main surface of the substrate 1 through, for example, thermal oxidation so as to have a thickness of about 10 nm. Then, a polycrystalline silicon film 5a to be a floating gate is deposited through, for example, CVD so as to have a thickness of about 200 nm. A n type impurity such as phosphorus is introduced to the polycrystalline silicon film 5a.

Figure 3A:
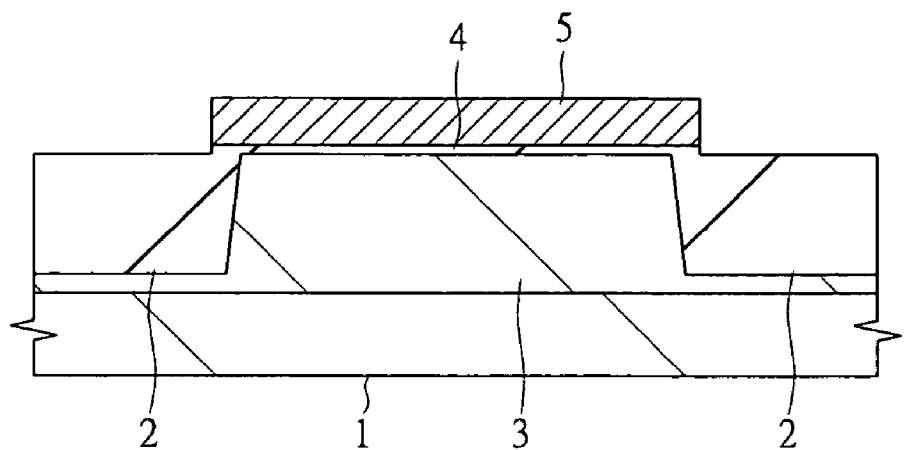
FIG. 3A is a cross-sectional view of main parts of the semiconductor substrate for describing the manufacturing process of a memory cell of the NOR flash memory according to the first embodiment of the present invention.

Next, as shown in FIG. 3A, the polycrystalline silicon film 5a is etched with using a resist pattern formed through photolithography as a mask and is patterned to form a floating gate 5.

Figure 3B:
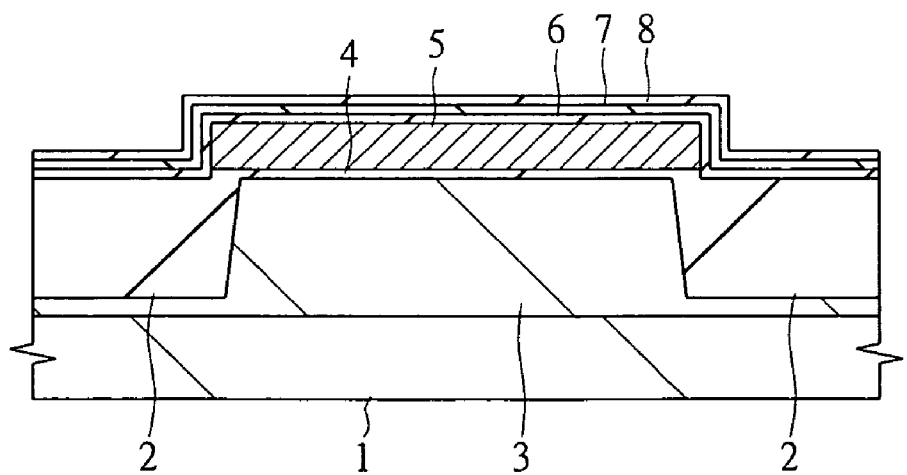
FIG. 3B is a cross-sectional view of main parts of the semiconductor substrate for describing the manufacturing process of a memory cell of the NOR flash memory according to the first embodiment of the present invention.

Next, as shown in FIG. 3B, a lower silicon oxide film 6 is deposited on the main surface of the substrate 1 through LPCVD using $SiH_2Cl_2$ and $N_2O$ as material gas at a temperature of, for example, 750° C. The thickness of the lower silicon oxide film 6 is, for example, about 5 nm. Subsequently, a silicon nitride film 7 is deposited on the lower silicon oxide film 6 through LPCVD using $SiH_2Cl_2$ and $NH_3$ as material gas. The thickness of the silicon nitride film 7 is, for example, about 8 nm. Subsequently, an upper silicon oxide film 8 is deposited on the silicon nitride film 7 through LPCVD using $SiH_2Cl_2$ and $N_2O$ as material gas at a temperature of, for example, 750° C. The thickness of the upper silicon nitride film 8 is, for example, about 1.5 to 3.5 nm. The lower silicon oxide film 6, silicon nitride film 7, and upper silicon oxide film 8 thus deposited form an ONO film to be an interlayer insulating film.

Figure 4:
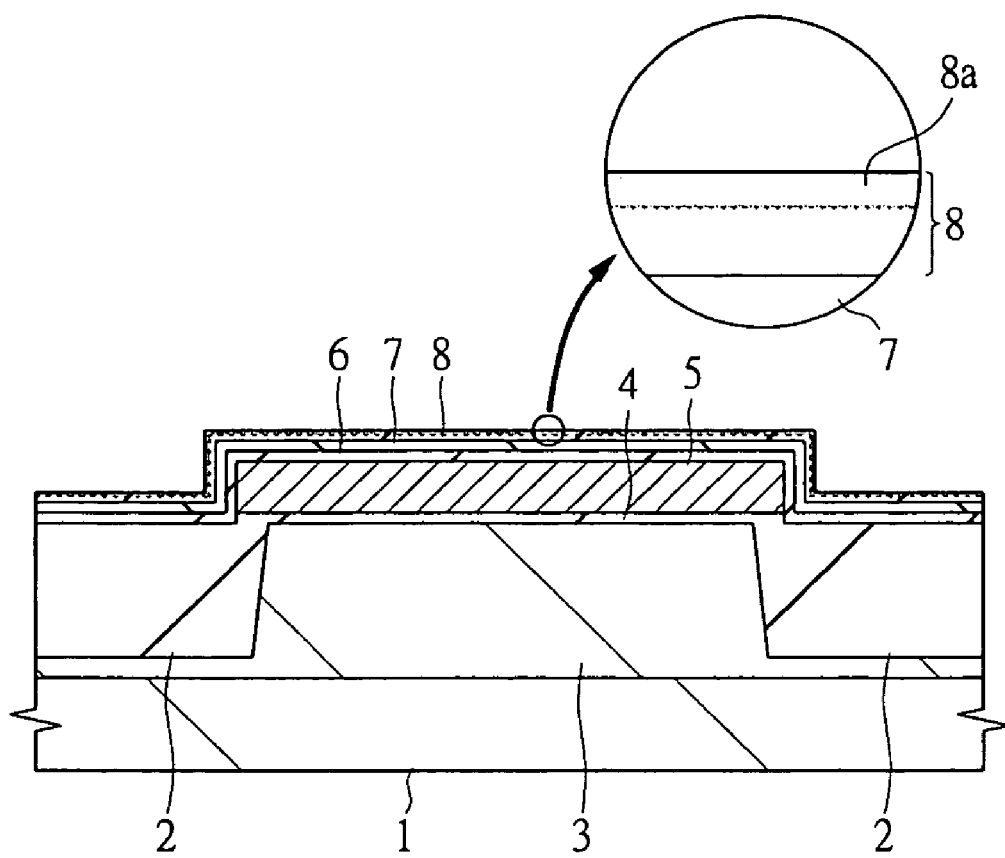
FIG. 4 is a cross-sectional view of main parts of the semiconductor substrate for describing the manufacturing process of a memory cell of the NOR flash memory according to the first embodiment of the present invention.

Next, as shown in FIG. 4, the upper silicon oxide film 8 is exposed to nitrogen radicals produced through a remote plasma process using $N_2$ and Ar as material gas to introduce nitrogen to an upper surface portion of the upper silicon oxide film 8. By this means, the structural defect (E' center) in the upper surface portion of the upper silicon oxide film 8 is terminated with nitrogen (in the enlarged view of FIG. 4, an area where nitrogen is introduced is denoted by a reference numeral 8a). The remote plasma process is a technology of directly nitriding the upper silicon oxide film by using high-reactive nitrogen radicals that have been excited and activated. In this process, the nitriding process can be performed at a temperature equal to or lower than 600° C., and only the upper surface portion of the upper silicon oxide film 8 can be nitrided. The depth where nitrogen is introduced is, for example, about 1 to 2 nm, and the nitrogen concentration of the upper surface portion of the upper silicon oxide film 8 can be higher than the nitrogen concentration of the lower surface portion (the surface in contact with the silicon nitride film 7) of the upper silicon oxide film 8 or that of the lower silicon oxide film 6. A suitable range of the nitrogen concentration of the upper surface portion of the upper silicon oxide film 8 is, for example, equal to or lower than 10 atom % (needless to say, this range is not meant to be restrictive depending on other conditions). Most preferably, the range is approximately from 5 to 6 atom %.

According to the measurement by the inventors, by nitriding the upper surface portion of the upper silicon oxide film 8 of the ONO film, the reduction in capacitance of the ONO film can be suppressed and a leakage current between the floating gate 5 and the control gate can be reduced. In particular, the leakage current when a negative voltage is applied to the floating gate 5 can be reduced approximately by two digits. For example, a withstand voltage for 1 $\mu A/cm^2$ in the case of an ONO film without introduction of nitrogen to the upper silicon oxide film 8 is 8 to 9 MV/cm. Meanwhile, a withstand voltage for 1 $\mu A/cm^2$ in the case of an ONO film with introduction of nitrogen of 5 to 6 atom % into the upper silicon oxide film 8 is 9 to 10 MV/cm. As described above, by nitriding the upper surface portion of the upper silicon oxide film 8, the leakage current is decreased and the charge retention characteristic of the memory cell is improved. Also, an ONO film including a nitrided upper silicon oxide film 8 with a thickness of 1.5 nm can achieve a charge retention characteristic equivalent to that of an ONO film including a non-nitrided upper silicon oxide film 8 with a thickness of 3.5 nm, and a coupling ratio of the memory cell can be improved. By this means, the equivalent oxide thickness of the ONO film can be made smaller than 15 nm, and therefore, the internal operating voltage of the memory cell at the time of writing and erasing can be reduced.

Figure 5A:
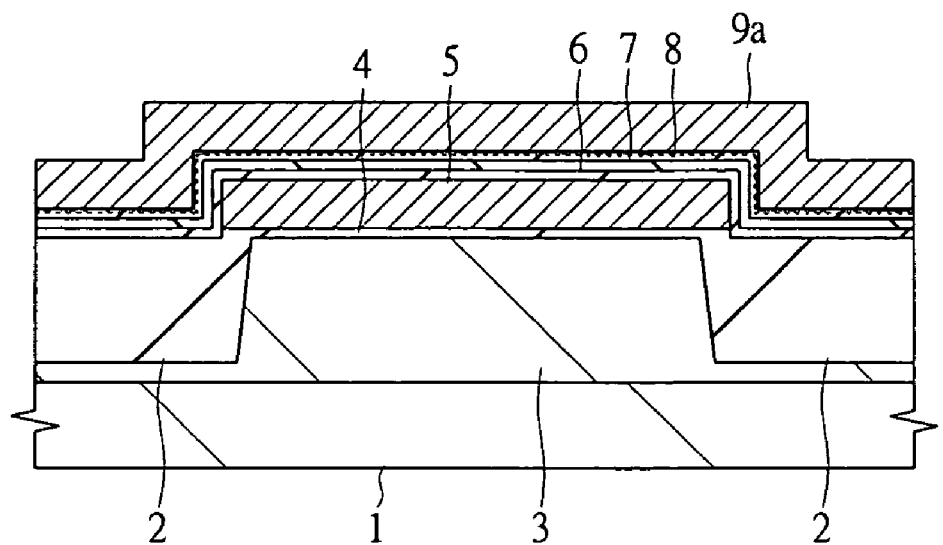
FIG. 5A is a cross-sectional view of main parts of the semiconductor substrate for describing the manufacturing process of a memory cell of the NOR flash memory according to the first embodiment of the present invention.

Next, as shown in FIG. 5A, a polycrystalline silicon film 9a to be a control gate is deposited on the upper silicon oxide film 8 through, for example, CVD. A n type impurity such as phosphorus is introduced to the polycrystalline silicon film 9a.

Figure 5B:
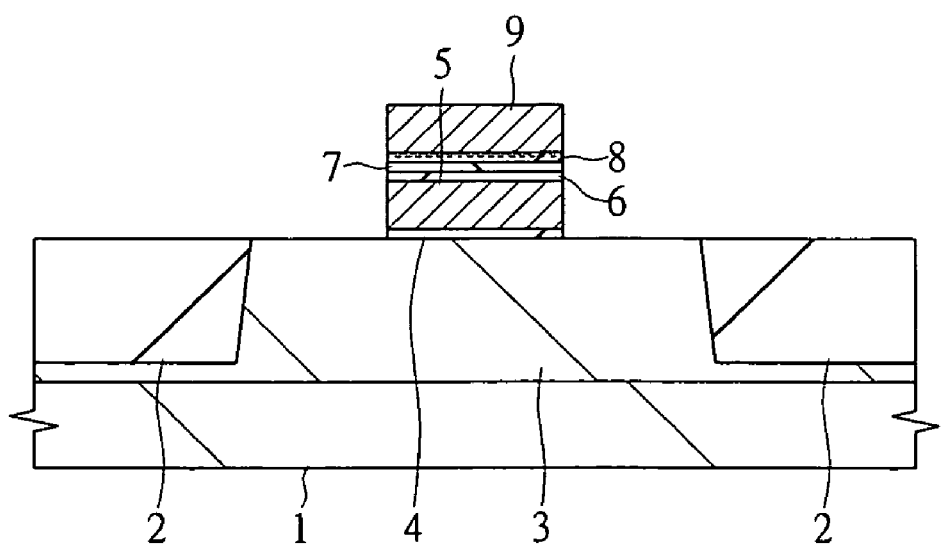
FIG. 5B is a cross-sectional view of main parts of the semiconductor substrate for describing the manufacturing process of a memory cell of the NOR flash memory according to the first embodiment of the present invention.

Next, as shown in FIG. 5B, the polycrystalline silicon film 9a is etched with using a resist pattern formed through photolithography as a mask to form a control gate 9 (word line) Then, the upper silicon oxide film 8, the silicon nitride film 7, the lower silicon oxide film 6, and the polycrystalline silicon film 5a are sequentially etched and patterned to form a floating gate 5 in a gate length direction. By this means, the floating gate 5 and the control gate 9 (word line) are formed.

Figure 6A:
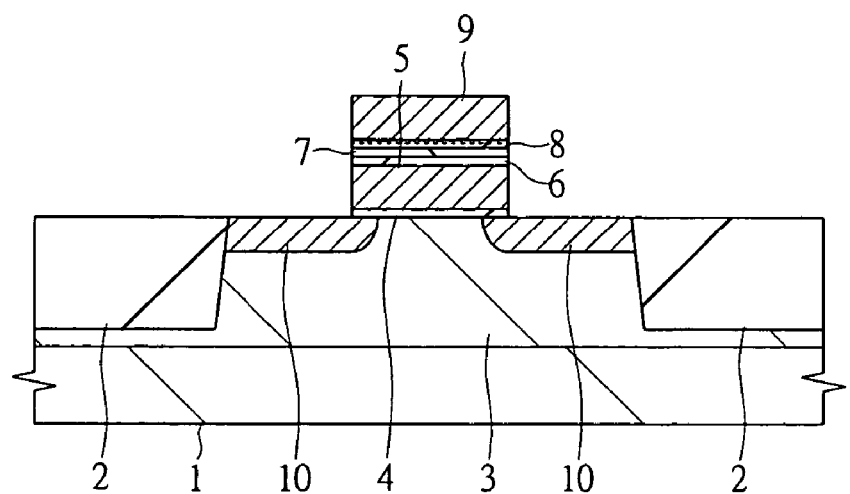
FIG. 6A is a cross-sectional view of main parts of the semiconductor substrate for describing the manufacturing process of a memory cell of the NOR flash memory according to the first embodiment of the present invention.

Next, as shown in FIG. 6A, a n type impurity such as arsenic is introduced to the well 3 with using a resist pattern formed through photolithography as a mask through ion implantation to form a source and a drain 10.

Figure 6B:
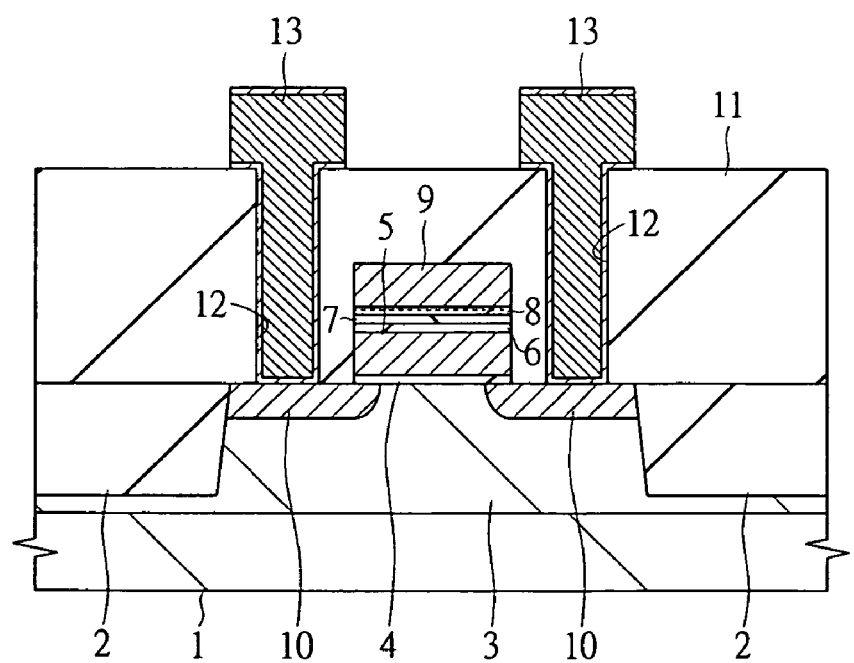
FIG. 6B is a cross-sectional view of main parts of the semiconductor substrate for describing the manufacturing process of a memory cell of the NOR flash memory according to the first embodiment of the present invention.

Next, as shown in FIG. 6B, after depositing an interlayer insulating film 11 on the main surface of the substrate 1, connection holes 12 are formed in the interlayer insulating film 11 so as to reach the source and the drain 10, the control gate 9 (word line), the well 3, and others. Subsequently, a metal film is deposited on the main surface of the substrate 1, and is then etched with using a resist pattern formed through photolithography as a mask, thereby forming wires 13. In this manner, a memory array is almost completed.

As described above, according to the first embodiment, the interlayer insulating film between the floating gate 5 and the control gate 9 of a memory cell included in a nonvolatile semiconductor memory device (NOR flash memory) is formed of an ONO film in which nitrogen is introduced to the upper surface portion of the upper silicon oxide film 8. Consequently, the charge retention characteristic of the memory cell can be improved. Also, the operating voltage of the memory cell can be reduced.

Second Embodiment

In the second embodiment, an exemplary case will be described in which the interlayer insulating film between the floating gate and the control gate in a nonvolatile memory cell is formed of a single-layer silicon oxide film formed through CVD, and nitrogen is added to the upper surface portion (the surface in contact with the control gate) of this silicon oxide film, thereby improving the charge retention characteristic.

A nonvolatile semiconductor memory device in the second embodiment is a NOR flash memory, and an equivalent circuit and its operating conditions of its memory array are identical to those of the memory array in the first embodiment described above.

A method of manufacturing a nonvolatile memory cell according to the second embodiment will be described in order of process steps with reference to FIG. 7 and FIG. 8. FIG. 7A and FIG. 7B are cross-sectional views of main parts taken along a gate width direction of the floating gate, and FIG. 8 is a cross-sectional view of the main parts taken along a gate length direction of the floating gate. Note that, since the manufacturing steps until the floating gate is patterned in a gate width direction are similar to those of the first embodiment described above, the description thereof is omitted here.

First, in a manner similar to that according to the first embodiment described above, device isolation regions 2 and a tunnel insulating film (silicon oxide film 4) are formed. Subsequently, a polycrystalline silicon film 5a is etched and patterned to form a floating gate 5 in a gate width direction.

Figure 7A:
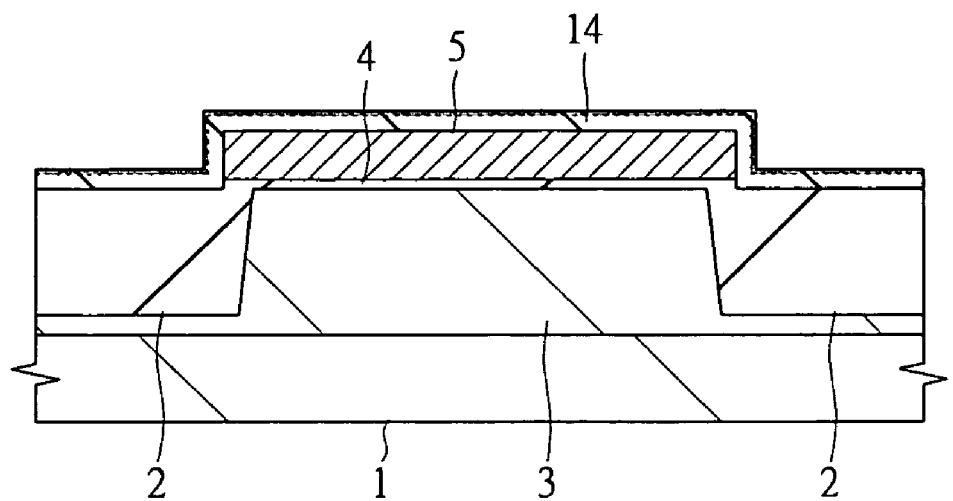
FIG. 7A is a cross-sectional view of main parts of a semiconductor substrate for describing a manufacturing process of a memory cell of a NOR flash memory according to a second embodiment of the present invention.
Figure 8:
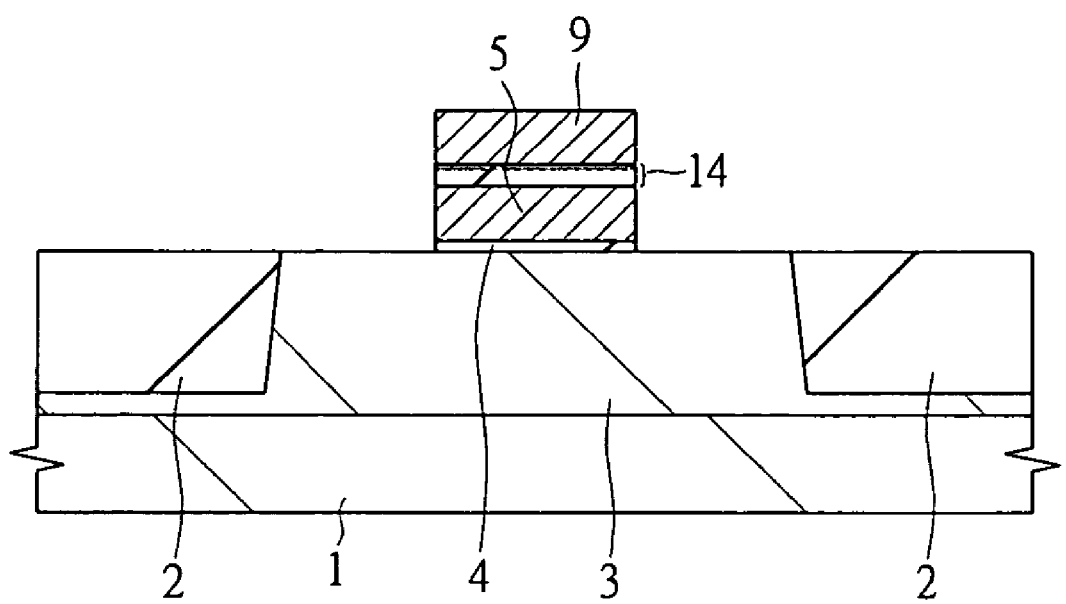
FIG. 8 is a cross-sectional view of main parts of the semiconductor substrate for describing the manufacturing process of a memory cell of the NOR flash memory according to the second embodiment of the present invention.

Next, as shown in FIG. 7A, a silicon oxide film 14 is deposited on the main surface of the substrate 1 through LPCVD using $SiH_2Cl_2$ and $N_2O$ as material gas at a temperature of, for example, 750° C. The thickness of the silicon oxide film 14 is, for example, about 11 nm. Immediately thereafter, nitrogen of, for example, 5 to 6 atom % is introduced to the upper surface portion of the silicon oxide film 14 through a remote plasma process using $N_2$ and Ar as material gas. By doing so, the nitrogen concentration of the upper surface portion of the silicon oxide film 14 is made higher than the nitrogen concentration of the lower surface portion (the surface in contact to the floating gate 5) of the silicon oxide film 14.

According to the measurement by the inventors, for example, a withstand voltage for 1 $\mu A/cm^2$ in the case of a silicon oxide film 14 without introduction of nitrogen is approximately 6 MV/cm. Meanwhile, a withstand voltage for 1 $\mu A/cm^2$ in the case of a silicon oxide film 14 with introduction of nitrogen to its upper surface portion is 7 to 8 MV/cm. As described above, by nitriding the upper surface portion of the silicon oxide film 14, the withstand voltage, that is, the leakage current is decreased, and the charge retention characteristic of the memory cell is improved. Also, a coupling ratio of the memory cell is improved, and therefore, the internal operating voltage of the memory cell can be reduced.

Figure 7B:
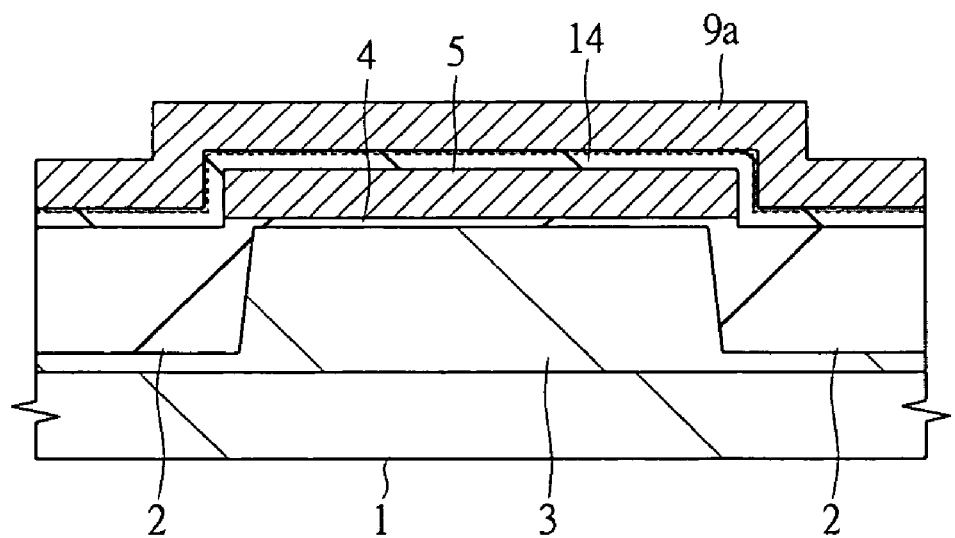
FIG. 7B is a cross-sectional view of main parts of the semiconductor substrate for describing the manufacturing process of a memory cell of the NOR flash memory according to the second embodiment of the present invention.

Next, as shown in FIG. 7B, a polycrystalline silicon film 9a to be a control gate is deposited on the silicon oxide film 14 through, for example, CVD. A n type impurity such as phosphorus is introduced to the polycrystalline silicon film 9a.

Next, as shown in FIG. 8, the polycrystalline silicon film 9a is etched with using a resist pattern formed through photolithography as a mask to form a control gate 9 (word line). Subsequently, the silicon oxide film 14 and the polycrystalline silicon film 5a are sequentially etched and patterned to form a floating gate 5 in a gate length direction. By this means, the floating gate 5 and the control gate 9 (word line) are formed.

After that, similar to the first embodiment described above, a source and a drain 10, wires 13, and others are formed. In this manner, a memory array is almost completed.

As described above, according to the second embodiment, the interlayer insulating film between the floating gate 5 and the control gate 9 of a memory cell included in a nonvolatile semiconductor memory device (NOR flash memory) is formed of the silicon oxide film 14 with nitrogen introduced to its upper surface portion. By this means, the charge retention characteristic of the memory cell can be improved. Also, the operating voltage of the memory cell can be reduced.

Third Embodiment

In the third embodiment, an exemplary case will be described in which the interlayer insulating film between the floating gate and the control gate in a nonvolatile memory cell is formed of a single-layer silicon oxide film formed through CVD, and nitrogen is added to the upper surface portion (the surface in contact with the control gate) and bulk of this silicon oxide film, thereby improving the charge retention characteristic.

A nonvolatile semiconductor memory device in the third embodiment is a NOR flash memory, and an equivalent circuit and its operating conditions of its memory array are identical to those of the memory array in the first embodiment described above.

A method of manufacturing a nonvolatile memory cell according to the third embodiment will be described in order of process steps with reference to FIG. 9 and FIG. 10. FIG. 9A and FIG. 9B are cross-sectional views of main parts taken along a gate width direction of the floating gate, and FIG. 10 is a cross-sectional view of the main parts taken along a gate length direction of the floating gate. Note that, since the manufacturing steps until the floating gate is patterned in a gate width direction are similar to those of the first embodiment described above, the description thereof is omitted here.

First, in a manner similar to that according to the first embodiment described above, device isolation regions 2 and a tunnel insulating film (silicon oxide film 4) are formed. Subsequently, a polycrystalline silicon film 5a is etched and patterned to form a floating gate 5 in a gate width direction.

Figure 9A:
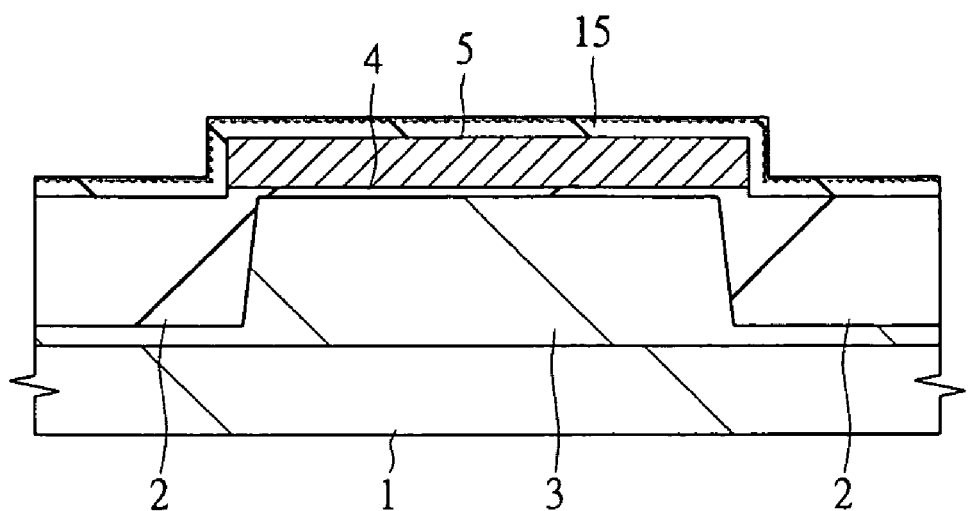
FIG. 9A is a cross-sectional view of main parts of a semiconductor substrate for describing a manufacturing process of a memory cell of a NOR flash memory according to a third embodiment of the present invention.
Figure 10:
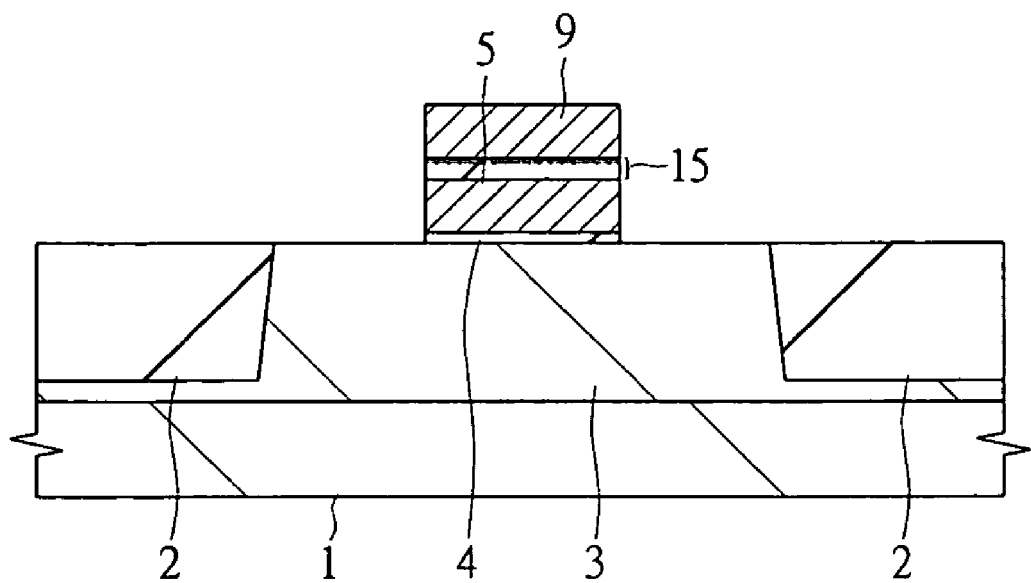
FIG. 10 is a cross-sectional view of main parts of the semiconductor substrate for describing the manufacturing process of a memory cell of the NOR flash memory according to the third embodiment of the present invention.

Next, as shown in FIG. 9A, a silicon oxide film 15 is deposited on the main surface of the substrate 1 through LPCVD using $SiH_2Cl_2$ and $N_2O$ as material gas at a temperature of, for example, 750° C. The thickness of the silicon oxide film 15 is, for example, about 11 nm. Immediately thereafter, the silicon oxide film 15 is subjected to a heat treatment in a $NH_3$ atmosphere at 850° C., and is then further subjected to a heat treatment in diluted wet oxygen at 850° C. Further, immediately thereafter, nitrogen of, for example, 5 to 6 atom %, is introduced to the upper surface portion of the silicon oxide film 15 through a remote plasma process using $N_2$ and Ar as material gas.

In the series of processes described above, nitrogen is first introduced into the entire silicon oxide film 15 through the heat treatment in the $NH_3$ atmosphere to reduce the structural defect (E' center). However, at the same time, hydrogen atoms are introduced to the silicon oxide film 15 and a new trap is formed. This trap serves as a storage place of electrons at the time of repeatedly writing and erasing the memory cell, and in a retention state where power is turned off, electrons are leaked to the erase gate to decrease a threshold voltage of the memory cell, that is, to cause a retention failure. For its prevention, a heat treatment is subsequently performed in diluted wet oxygen, thereby removing the hydrogen atoms in the silicon oxide film 15 and suppressing the retention failure. Furthermore, by introducing nitrogen of 5 to 6 atom % into the upper surface portion of the silicon oxide film 15 through the remote plasma process, the nitrogen concentration of the upper surface portion of the silicon oxide film 15 is made higher than the nitrogen concentration of the lower surface portion (the surface in contact with the floating gate 5) of the silicon oxide film 15. By this means, the leakage current of the silicon oxide film 15 is reduced.

According to the measurement by the inventors, for example, a withstand voltage for 1 $\mu$A/cm$^2$ in the case of a silicon oxide film 15 without introduction of nitrogen is approximately 6 MV/cm. Meanwhile, a withstand voltage for 1 $\mu$A/cm$^2$ in the case of a silicon oxide film 15 with introduction of nitrogen to its upper surface portion and bulk is approximately 8 MV/cm. As described above, by nitriding the upper surface portion and bulk of the silicon oxide film 15, the withstand voltage, that is, the leakage current is decreased and the charge retention characteristic of the memory cell is improved. For example, in the silicon oxide film 15 with a thickness of 11 nm, a charge retention characteristic equivalent to that of an ONO film with an equivalent oxide thickness of 15 nm can be achieved. Also, a coupling ratio of the memory cell is improved, and therefore, the internal operating voltage of the memory cell can be reduced.

Figure 9B:
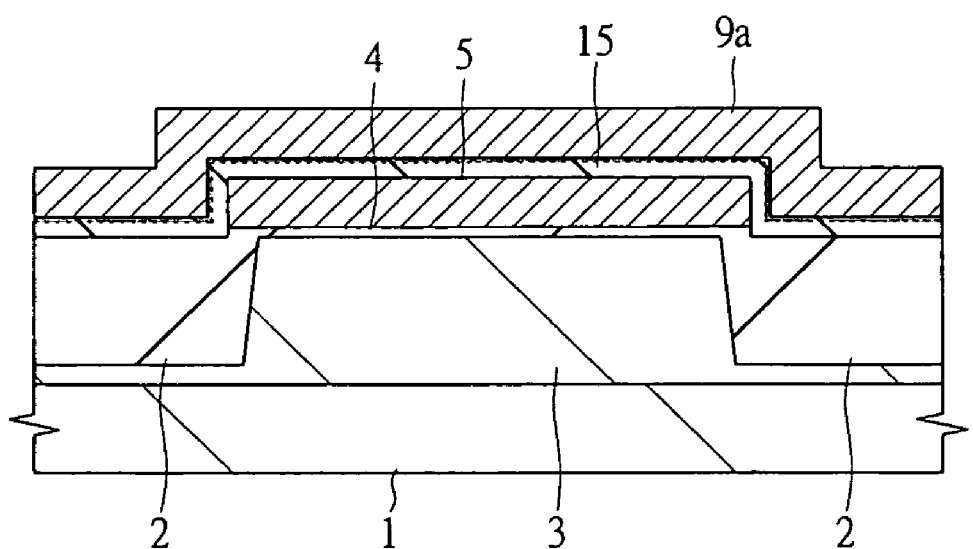
FIG. 9B is a cross-sectional view of main parts of the semiconductor substrate for describing the manufacturing process of a memory cell of the NOR flash memory according to the third embodiment of the present invention.

Next, as shown in FIG. 9B, a polycrystalline silicon film 9a to be a control gate is deposited on the silicon oxide film 15 through, for example, CVD. A n type impurity such as phosphorus is introduced to the polycrystalline silicon film 9a.

Next, as shown in FIG. 10, the polycrystalline silicon film 9a is etched with using a resist pattern formed through photolithography as a mask to form a control gate 9 (word line). Then, the silicon oxide film 15 and the polycrystalline silicon film 5a are sequentially etched and patterned to form a floating gate 5 in a gate length direction. By this means, the floating gate 5 and the control gate 9 (word line) are formed.

After that, similar to the first embodiment described above, a source and a drain 10, wires 13, and others are formed. In this manner, a memory array is almost completed.

As described above, according to the third embodiment, the interlayer insulating film between the floating gate 5 and the control gate 9 of a memory cell included in a nonvolatile semiconductor memory device (NOR flash memory) is formed of the silicon oxide film 15 with nitrogen introduced to its upper surface portion and bulk. By this means, the charge retention characteristic of the memory cell can be improved. Also, the operating voltage of the memory cell can be reduced.

Fourth Embodiment

In the fourth embodiment, an exemplary case will be described in which, in a nonvolatile memory cell having an assist gate which is a third gate in addition to the floating gate and the control gate, the interlayer insulating film between the assist gate and the floating gate is composed of a silicon oxide film formed through CVD, and nitrogen is added to the upper surface portion (the surface in contact with the floating gate) of this silicon oxide film, thereby improving the disturbance resistance. In the fourth embodiment, a metal insulator semiconductor field effect transistor (MISFET), which is a typical field-effect transistor, is abbreviated as a MIS.

Figure 11:
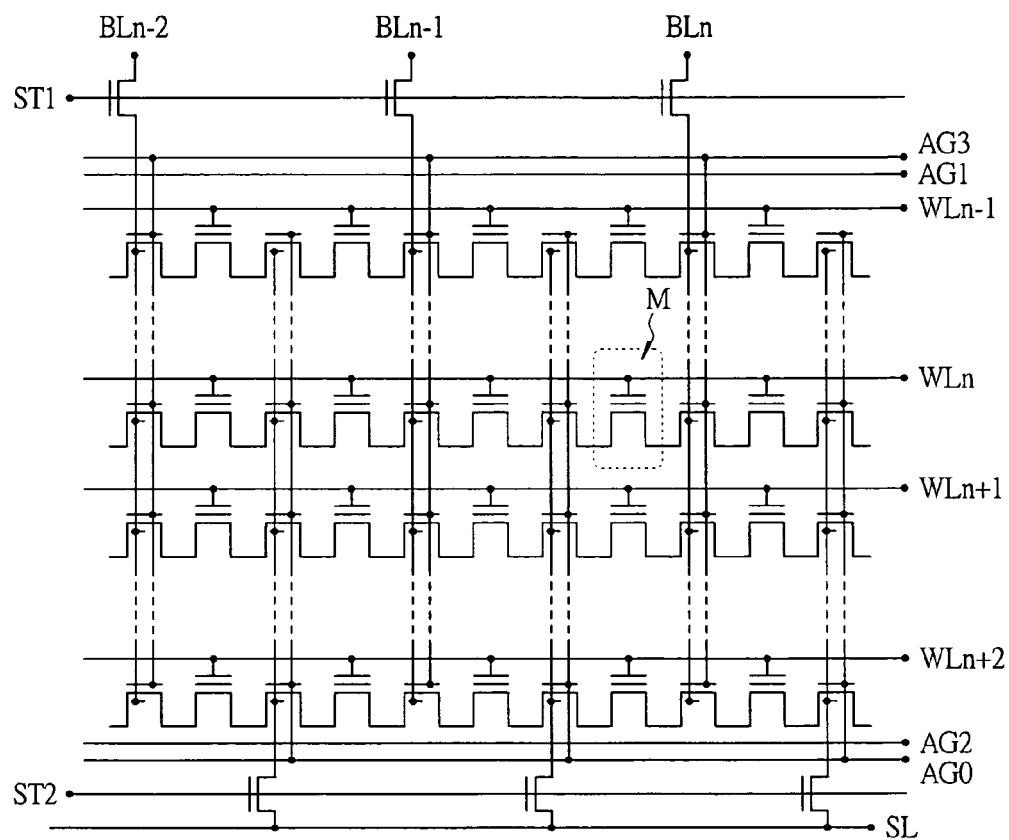
FIG. 11 is a drawing of an equivalent circuit of a memory array of an AG-AND flash memory according to a fourth embodiment of the present invention.

A nonvolatile semiconductor memory device in the fourth embodiment is a so-called AG-AND flash memory. FIG. 11 is a drawing of an equivalent circuit of a memory cell array.

In the fourth embodiment, every four assist gates are grouped into one. A voltage can be applied to inversion layers formed under assist gates AG1 and AG3 from bit lines BLn-2, BLn-1, and BLn, and a voltage can be applied to inversion layers formed under assist gates AG0 and AG2 from a common source line SL. At the time of reading, a voltage of about 5 V is applied to the gates of selected MISes at both ends of the memory array. Furthermore, a voltage of about 4 V is applied to assist gates at both sides of a selected cell M to form inversion layers on the surface of the substrate under the assist gates, and this inversion layers are used as a source and a drain. A voltage of 0 V or a negative voltage is applied to unselected word lines WLn-1, WLn+1, and WLn+2 to set these unselected cells to OFF state, and a positive voltage is applied to a selected word line WLn, thereby determining a threshold voltage of the selected cell M.

Writing can be performed through source-side hot electron injection, which has high injection efficiency and low current consumption. At the time of writing to the selected cell M, a voltage of about 6 V is applied to a gate ST1 of the selected MIS on the bit line side. A voltage of about 15 V is applied to the control gate (word line WLn) of the selected cell M, a voltage of about 4.5 V is applied to the bit line BLn, a voltage of about 8 V is applied to the assist gate AG3 on the bit line BLn side, a voltage of about 4 V is applied to the assist gate AG1 on the bit line BLn-1 side, and the well is held at 0 V. Furthermore, a voltage of about 1 V is applied to the assist gate AG2. When the bit line BLn-1 is at 0 V, the surface of the substrate under the assist gate AG2 becomes weak inversion state, and a channel current occurs between the bit line BLn and the bit line BLn-1 via a channel under the selected cell M. At this time, hot electrons are produced in a channel between the floating gate and the assist gate AG2 of the selected cell M, and electrons are injected to the floating gate. If the bit line BLn-1 is at approximately 2 V, the assist gate AG2 is cut off and no current flows. Thus, writing can be stopped.

In the case of erasing, a negative voltage of, for example, -18 V is applied to the selected word line WLn, and all of the bit lines BLn-2, BLn-1, and BLn, the source line SL, the assist gates AG0, AG1, AG2, and AG3, the wells, and the unselected word lines WLn-1, WLn+1, and WLn+2 are held at 0V. By this means, in all of the memory cells on the selected word line WLn, electrons are emitted from the floating gate to the wells due to the Fowler-Nordheim tunneling phenomenon, the threshold voltage of the memory cell is decreased. Thus, erasing is performed.

Next, a method of manufacturing a nonvolatile memory cell of the nonvolatile semiconductor memory device according to the fourth embodiment will be described in order of process steps with reference to FIG. 12 to FIG. 16.

Figure 12A:
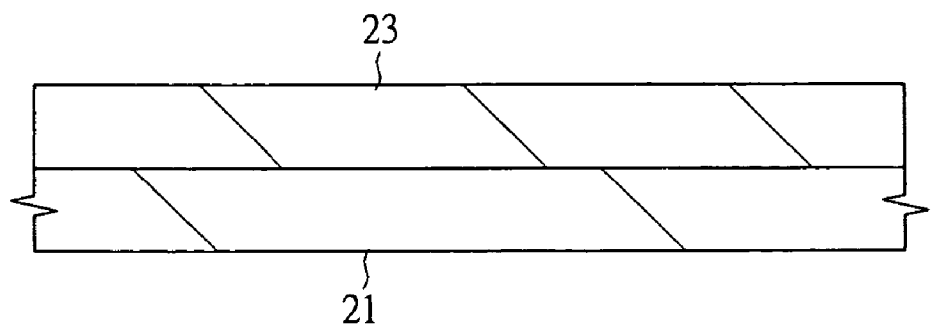
FIG. 12A is a cross-sectional view of main parts of a semiconductor substrate for describing a manufacturing process of a memory cell of the AG-AND flash memory according to the fourth embodiment of the present invention.

First, as shown in FIG. 12A, shallow device isolation regions are formed in a main surface of a substrate 21 made of p type single-crystal silicon with (100) orientation. Then, a well 23 is formed through ion implantation and heat treatment.

Figure 12B:
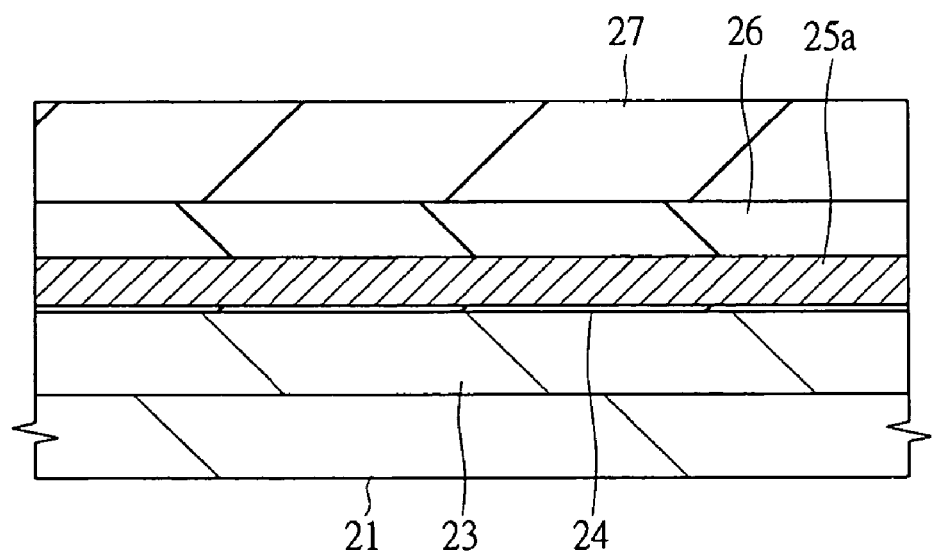
FIG. 12B is a cross-sectional view of main parts of the semiconductor substrate for describing the manufacturing process of a memory cell of the AG-AND flash memory according to the fourth embodiment of the present invention.

Next, as shown in FIG. 12B, a silicon oxide film 24 with a thickness of, for example, about 9 nm to be a gate insulating film of an assist gate of a memory cell portion and a gate insulating film of a peripheral-circuit low-voltage MIS is formed. Also, a silicon oxide film with a thickness of, for example, about 25 nm to be a gate insulating film of a peripheral-circuit high-voltage MIS. Subsequently, a polycrystalline silicon film 25a, a silicon nitride film 26, and a silicon oxide film 27 to be the assist gate of the memory cell portion and a gate of a MIS of a peripheral circuit are sequentially deposited through, for example, CVD. A n type impurity such as phosphorus is introduced to the polycrystalline silicon film 25a.

Figure 13A:
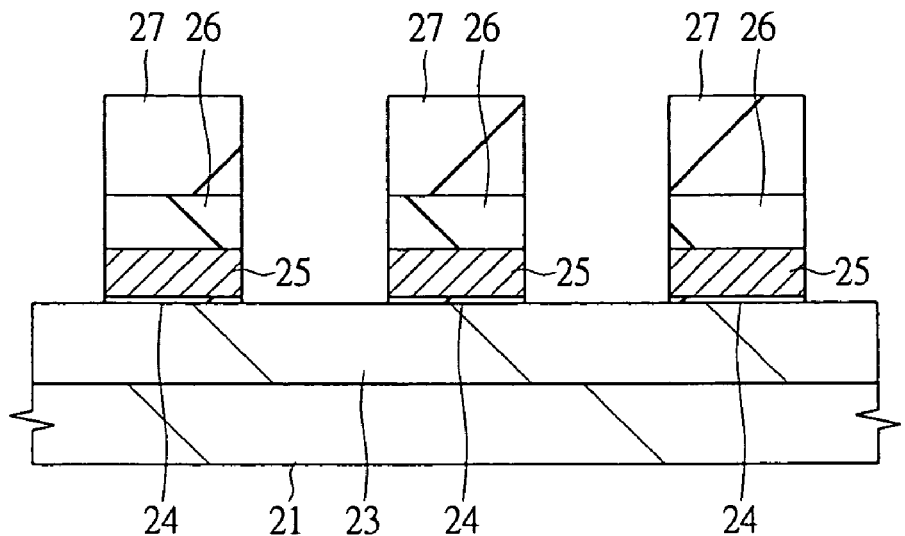
FIG. 13A is a cross-sectional view of main parts of the semiconductor substrate for describing the manufacturing process of a memory cell of the AG-AND flash memory according to the fourth embodiment of the present invention.

Next, as shown in FIG. 13A, the silicon oxide film 27, the silicon nitride film 26, and the polycrystalline silicon film 25a are sequentially etched with using a resist pattern formed through photolithography as a mask and are patterned to form assist gates 25 formed of the polycrystalline silicon film 25a.

Figure 13B:
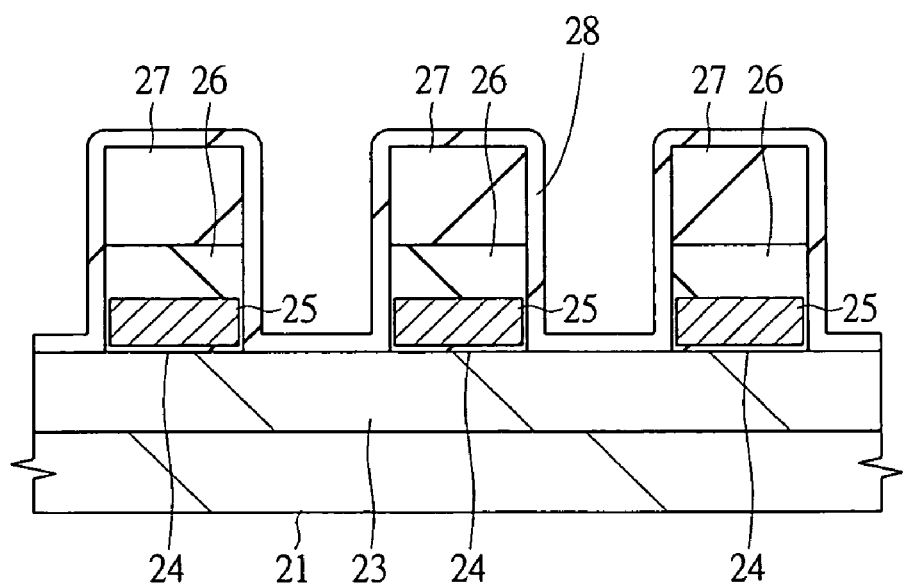
FIG. 13B is a cross-sectional view of main parts of the semiconductor substrate for describing the manufacturing process of a memory cell of the AG-AND flash memory according to the fourth embodiment of the present invention.

Next as shown in FIG. 13B, after forming a silicon oxide film on sidewalls of the assist gates 25 through, for example, thermal oxidation, a silicon oxide film 28 to be an interlayer insulating film for separating the assist gate 25 and a floating gate formed in a subsequent process is deposited on the main surface of the substrate 21 through LPCVD using $SiH_2Cl_2$ and $N_2O$ as material gas.

Figure 14A:
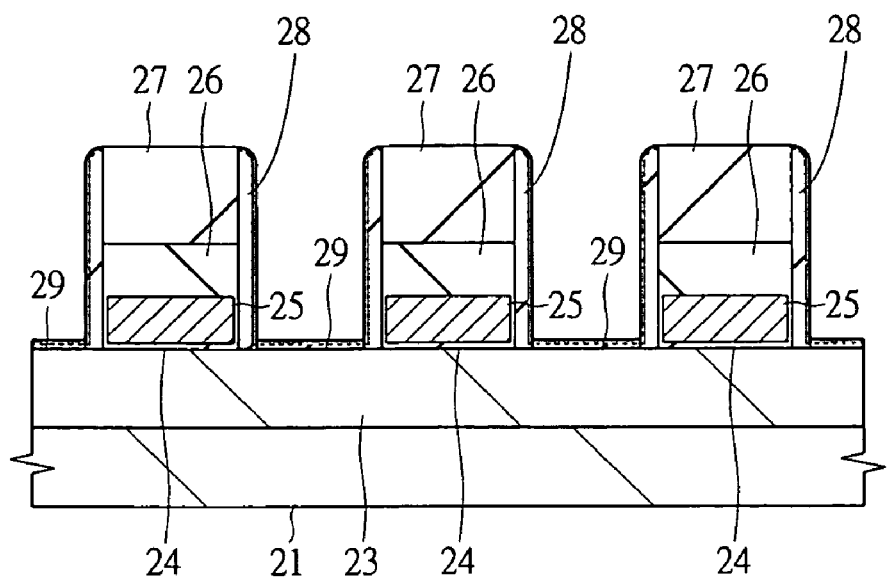
FIG. 14A is a cross-sectional view of main parts of the semiconductor substrate for describing the manufacturing process of a memory cell of the AG-AND flash memory according to the fourth embodiment of the present invention.

Next, as shown in FIG. 14A, the silicon oxide film 28 is etched back through anisotropic etching so as to leave the silicon oxide film 28 in a sidewall shape on the sidewalls of the assist gates 25. Subsequently, a silicon oxide film 29 to be a tunnel insulating film is formed on the exposed main surface of the substrate 21 through, for example, thermal oxidation. The thickness of the silicon oxide film 29 is, for example, about 9 nm. Thereafter, nitrogen is introduced into the upper surface portion of the silicon oxide film 28 through a remote plasma process using $N_2$ and Ar as material gas. By this means, the nitrogen concentration of the upper surface portion of the silicon oxide film 28 is made higher than the nitrogen concentration of the lower surface portion (the surface in contact with the assist gate 25) of the silicon oxide film 28. In the upper surface portion of the silicon oxide film 28, an E' center which causes the weak electron tunneling in memory cells on the unselected word lines at the time of writing is formed. However, by introducing nitrogen of, for example, 5 to 6 atom % into the upper surface portion of the silicon oxide film 28 through the remote plasma process, the E' center in the upper surface portion of the silicon oxide film 28 is terminated with nitrogen. By this means, the leakage current between the assist gate 25 and the floating gate can be reduced. At this time, nitrogen is also introduced into the upper surface portion (the surface in contact with the floating gate) of the silicon oxide film 29.

According to the measurement by the inventors, for example, a withstand voltage for 1 $\mu A/cm^2$ in the case of a silicon oxide film 28 without introduction of nitrogen is approximately 6 MV/cm. Meanwhile, a withstand voltage for 1 $\mu A/cm^2$ in the case of a silicon oxide film 28 with introduction of nitrogen of 5 to 6 atom % into its upper surface portion is approximately 8 MV/cm. As described above, by nitriding the upper surface portion of the silicon oxide film 28, the withstand voltage, that is, the leakage current is decreased, and thus, it is possible to suppress the decrease in threshold voltage (disturbance) of the memory cell in a writing state.

Figure 14B:
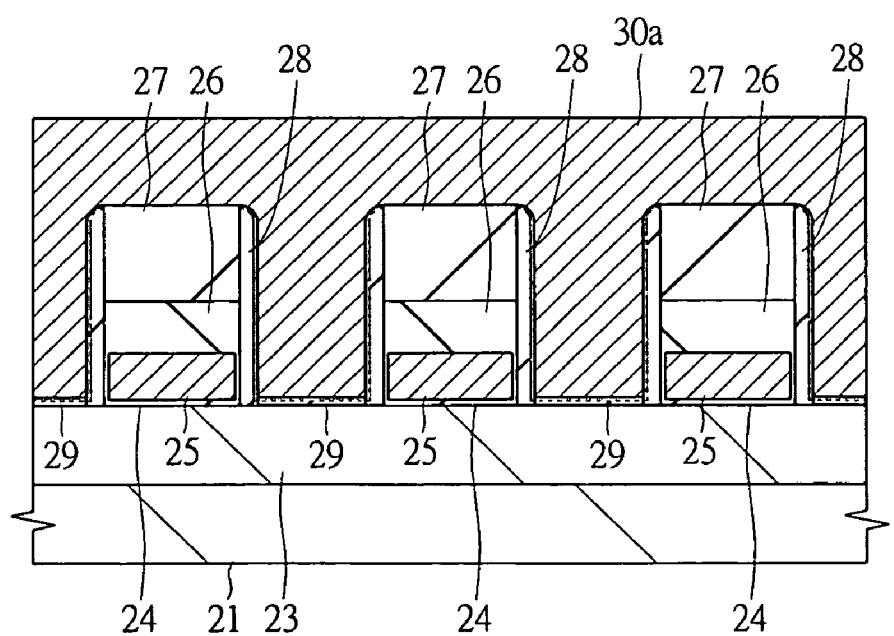
FIG. 14B is a cross-sectional view of main parts of the semiconductor substrate for describing the manufacturing process of a memory cell of the AG-AND flash memory according to the fourth embodiment of the present invention.

Next, as shown in FIG. 14B, a polycrystalline silicon film 30a to be floating gates is deposited on the main surface of the substrate 21 through, for example, CVD so as to completely fill the spaces between adjacent assist gates 25 with the polycrystalline silicon film 30a. A n type impurity such as phosphorus is introduced to the polycrystalline silicon film 30a.

Figure 15A:
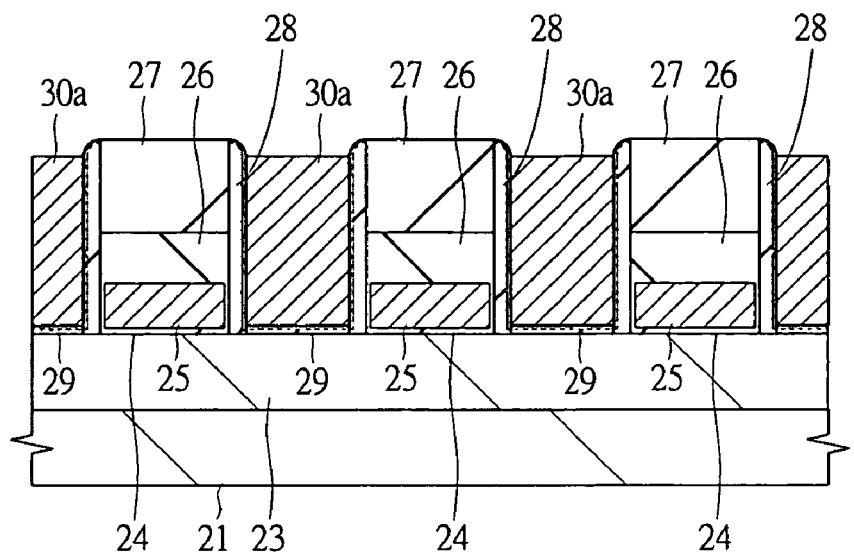
FIG. 15A is a cross-sectional view of main parts of the semiconductor substrate for describing the manufacturing process of a memory cell of the AG-AND flash memory according to the fourth embodiment of the present invention.

Next, as shown in FIG. 15A, the polycrystalline silicon film 30a is etched through anisotropic etch-back so that the polycrystalline silicon film 30a is left only in the spaces between the adjacent assist gates 25.

Figure 15B:
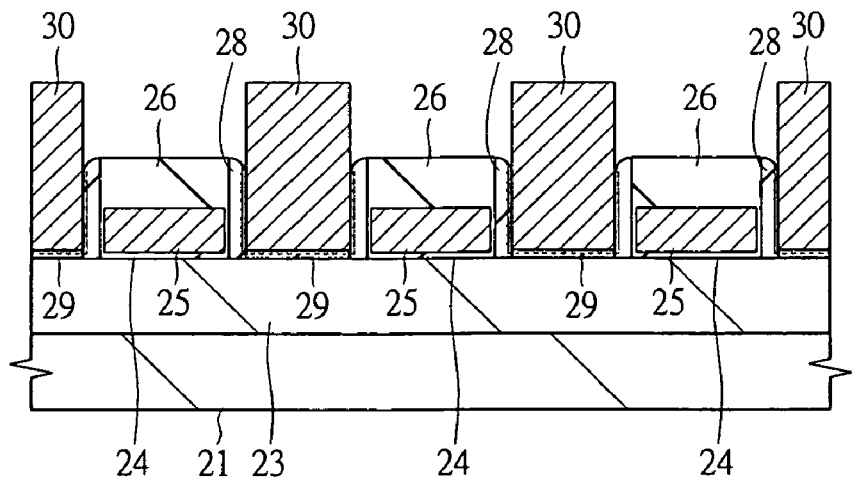
FIG. 15B is a cross-sectional view of main parts of the semiconductor substrate for describing the manufacturing process of a memory cell of the AG-AND flash memory according to the fourth embodiment of the present invention.

Next, as shown in FIG. 15B, the silicon oxide films 27 on the assist gates 25 are removed through, for example, dry etching and patterned to form stripe-shaped floating gates 30 in a gate width direction. At this time, the silicon oxide films 28 are also etched back.

Figure 16A:
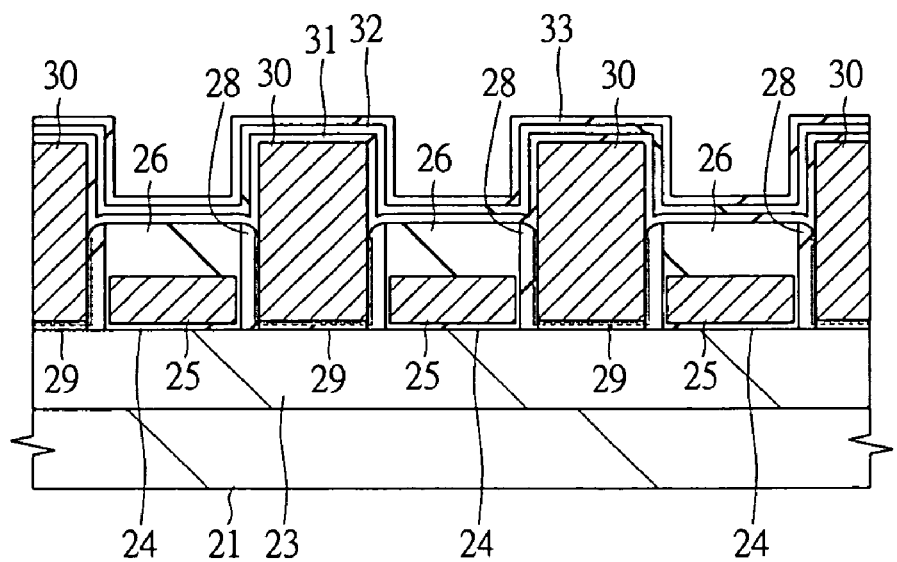
FIG. 16A is a cross-sectional view of main parts of the semiconductor substrate for describing the manufacturing process of a memory cell of the AG-AND flash memory according to the fourth embodiment of the present invention.

Next, as shown in FIG. 16A, a lower silicon oxide film 31, a silicon nitride film 32, and an upper silicon oxide film 33 are sequentially deposited on the main surface of the substrate 21 through, for example, LPCVD to form an ONO film to be an interlayer insulating film between the floating gate 30 and the control gate to be formed later.

Figure 16B:
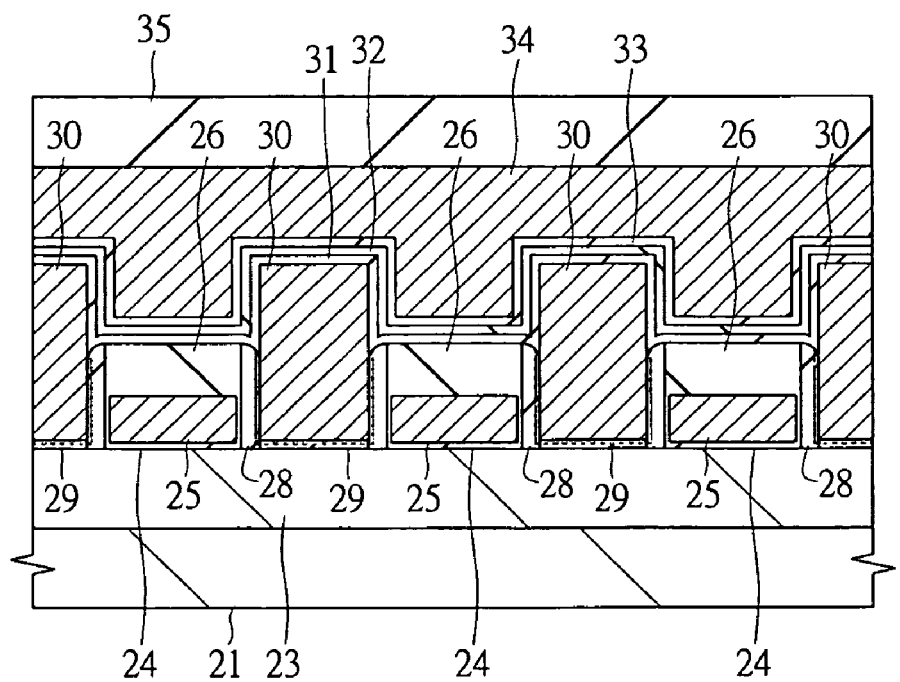
FIG. 16B is a cross-sectional view of main parts of the semiconductor substrate for describing the manufacturing process of a memory cell of the AG-AND flash memory according to the fourth embodiment of the present invention.

Next, as shown in FIG. 16B, after sequentially depositing a polycrystalline silicon film to be a control gate and a silicon oxide film 35 on the main surface of the substrate 21, the silicon oxide film 35 and the polycrystalline silicon film are sequentially etched with using a resist pattern formed through photolithography as a mask to form a control gate 34 (word line) composed of the polycrystalline silicon film. Subsequently, the upper silicon oxide film 33, the silicon nitride film 32, the lower silicon oxide film 31, and the polycrystalline silicon layer 30a are sequentially etched and patterned to form the floating gate 30 in a gate length direction. In this manner, the floating gate 30 and the control gate 34 (word line) are formed.

Next, after forming a source and a drain of each peripheral-circuit MIS and the selected MIS through ion implantation, an interlayer insulating film is deposited on the main surface of the substrate 21. Subsequently, connection holes are formed in the interlayer insulating film so as to reach the gate 34 (word line), the assist gate 25, the well 23, the gate of MIS in a peripheral-circuit MIS, the gate of the selected MIS, the source and the drain of the selected MIS, and others. Then, after forming plugs made of, for example, a tungsten film in the connection holes, wires mainly made of, for example, aluminum are formed. In this manner, a memory array is almost completed.

As described above, according to the fourth embodiment, the interlayer insulating film between the assist gate 25 and the floating gate 30 of a memory cell included in a nonvolatile semiconductor memory device (AG-AND flash memory) is formed of the silicon oxide film 28 with nitrogen introduced into its upper surface portion. Consequently, the disturbance resistance of the memory cell can be improved.

Fifth Embodiment

In the fifth embodiment, an exemplary case will be described in which, in a nonvolatile memory cell having an assist gate which is a third gate in addition to the floating gate and the control gate, the interlayer insulating film between the assist gate and the floating gate is composed of a silicon oxide film to which nitrogen is introduced.

A nonvolatile semiconductor memory device according to the fifth embodiment is an AG-AND flash memory, and an equivalent circuit and its operating conditions are identical to those of the memory array according to the fourth embodiment described above.

Next, a method of manufacturing a nonvolatile memory cell according to the fifth embodiment will be described in order of process steps with reference to FIG. 17 and FIG. 18. Note that, since a manufacturing process of patterning an assist gate is similar to that according to the fourth embodiment, the description thereof is omitted here.

Firstly, as shown in FIG. 17A, in the same manner as that of the fourth embodiment described above, after a device isolation and patterning to form an assist gate 25, a silicon oxide film is formed on a sidewall of the assist gate 25 through thermal oxidation. Subsequently, a silicon oxide film 36 to be an interlayer insulating film for separating the assist gate 25 and a floating gate formed in a subsequent process is deposited on the main surface of the substrate 21 through LPCVD using $SiH_2Cl_2$ and $N_2O$ as material gas at a temperature of, for example, 800° C.

Next, as shown in FIG. 17B, in the same manner as that of the third embodiment described above, immediately after the deposition of the silicon oxide film 36, the silicon oxide film 36 is subjected to a heat treatment in an $NH_3$ atmosphere at 850° C., and is then further subjected to a heat treatment in diluted wet oxygen at 850° C. Subsequently, the silicon oxide film 36 is etched back through anisotropic etching so as to leave the silicon oxide film 36 in a sidewall shape on the sidewall of the assist gate 25.

Next, as shown in FIG. 18, a silicon oxide film 29 to be a tunnel insulating film is formed on the exposed main surface of the substrate 21 through, for example, thermal oxidation. Thereafter, nitrogen is introduced into the upper surface portion (the surface in contact with the floating gate) of the silicon oxide film 36 through a remote plasma process using $N_2$ and Ar as material gas. By this means, the nitrogen concentration of the upper surface portion of the silicon oxide film 36 is made higher than the nitrogen concentration of the lower surface portion (the surface in contact with the assist gate 25) of the silicon oxide film 36. In this manner, nitrogen of, for example, 5 to 6 atom % is introduced into the bulk of the silicon oxide film 36 and also into its upper surface portion. Furthermore, nitrogen is also introduced into the upper surface portion of the silicon oxide film 29.

According to the measurement by the inventors, for example, a withstand voltage for 1 $\mu A/cm^2$ in the case of a silicon oxide film 36 without introduction of nitrogen is approximately 6 MV/cm. Meanwhile, a withstand voltage for 1 $\mu A/cm^2$ in the case of a silicon oxide film 36 with introduction of nitrogen of 5 to 6 atom % into its upper surface is 8 to 9 MV/cm. As described above, by nitriding the upper surface portion and bulk of the silicon oxide film 36, the withstand voltage, that is, the leakage current is decreased. Consequently, it is possible to suppress a decrease in threshold voltage (disturbance) of the memory cell in a writing state.

Thereafter, in the same manner as that of the fourth embodiment described above, a floating gate 30, a control gate 34, wires, and others are formed. In this manner, a memory array is almost completed.

As described above, according to the fifth embodiment, the interlayer insulating film between the assist gate 25 and the floating gate 30 of a memory cell included in a nonvolatile semiconductor memory device (AG-AND flash memory) is formed of the silicon oxide film 36 with nitrogen introduced into its upper surface portion. Consequently, the disturbance resistance of the memory cell can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first to fifth embodiments described above, $SiH_2Cl_2$ and $N_2O$ are used as material gas for forming a silicon oxide film to which nitrogen is introduced. Alternatively, another material gas such as $SiH_4$ and $H_2O$ can be used to achieve similar effects.

Also, in the fourth and fifth embodiments described above, the silicon oxide film to which nitrogen is added described in the first embodiment can be used as the upper silicon oxide film of the interlayer insulating film formed of an ONO film between the floating gate and the control gate, and the similar effects can be achieved also in this case. Furthermore, in place of the ONO film, the single-layer silicon oxide film to which nitrogen is added described in the second and third embodiments can be used as the interlayer insulating film between the floating gate and the control gate, and the similar effects can be achieved also in this case.

Still further, a NOR flash memory is taken as an example for the description in the first, second, and third embodiments, and an AG-AND flash memory is taken as an example for the description in the fourth and fifth embodiments. Alternatively, the present invention can be applied to other memory cells such as an NAND memory, a DiNOR memory, and a split-gate flash memory, and the similar effects can be achieved also in this case.

Still further, the similar effects can also be achieved by applying the present invention to so-called multi-level storage in which four or more threshold states are formed in one memory cell for the storage of 2 bits or more. In the multi-level storage, the amount of change in threshold from a lowest threshold level to a highest threshold level is large. Therefore, in order to achieve a write/erase speed equivalent to that in binary storage (one bit/cell), a higher coupling ratio is desired for the memory cell. Also, in the multi-level storage, in order to decrease the above-stated amount of change in threshold, a difference in voltage among the respective threshold distributions is made small. Thus, a charge retention characteristic or disturbance resistance that is superior in comparison to that in the binary storage is demanded. According to the present invention, the leakage current between the floating gate and another gate can be reduced, which is suited for the multi-level storage.

The semiconductor device according to the present invention is suitable for use in a memory device for small-sized, portable information equipment such as portable personal computers or digital still cameras.

What is claimed is:

1. A semiconductor device comprising an upper polycrystalline silicon film and a lower polycrystalline silicon film,
    wherein an interlayer insulating film, including a silicon oxide film which contains nitrogen, is interposed between said upper polycrystalline silicon film and said lower polycrystalline silicon film,
    an upper surface portion of said silicon oxide film is in contact with said upper polycrystalline silicon film, and
    a nitrogen concentration of the upper surface portion of said silicon oxide film is higher than a nitrogen concentration of a lower surface portion of said silicon oxide film.

2. The semiconductor device according to claim 1,
    wherein said interlayer insulating film is formed of said silicon oxide film, and the nitrogen concentration of the upper surface portion of said silicon oxide film is equal to or lower than 10 atom %.

3. The semiconductor device according to claim 1,
    wherein said interlayer insulating film is formed of said silicon oxide film, and the nitrogen concentration of the upper surface portion of said silicon oxide film is 5 to 6 atom %.

4. The semiconductor device according to claim 1,
    wherein said silicon oxide film is formed on a multilayer film obtained by sequentially depositing a lower silicon oxide film and a silicon nitride film.

5. The semiconductor device according to claim 4,
    wherein the nitrogen concentration of the upper surface portion of said silicon oxide film formed on the multilayer film is 5 to 6 atom %.

6. The semiconductor device according to claim 1,
wherein said upper polycrystalline silicon film and said lower polycrystalline silicon film form gates of a memory cell.

7. The semiconductor device according to claim 1,
wherein a structural defect in the upper surface portion of said silicon oxide film is terminated with nitrogen.

8. A semiconductor device comprising a memory cell array having a plurality of memory cells disposed in matrix form, each memory cell including a field-effect transistor having a floating gate formed on a first insulating film on a substrate and a control gate formed on a second insulating film on said floating gate,
wherein the second insulating film includes an upper silicon oxide film which contains nitrogen,
an upper surface portion of said upper silicon oxide film is in contact with the control gate, and
a nitrogen concentration of the upper surface portion of said upper silicon oxide film is higher than a nitrogen concentration of a lower surface portion of said upper silicon oxide film.

9. The semiconductor device according to claim 8,
wherein said second insulating film is formed of the upper silicon oxide film, and the nitrogen concentration of the upper surface portion of said upper silicon oxide film is equal to or lower than 10 atom %.

10. The semiconductor device according to claim 8,
wherein said second insulating film is formed of the upper silicon oxide film, and the nitrogen concentration of the upper surface portion of said upper silicon oxide film is 5 to 6 atom %.

11. The semiconductor device according to claim 8,
wherein said upper silicon oxide film is formed on a multilayer film obtained by sequentially depositing a lower silicon oxide film and a silicon nitride film.

12. The semiconductor device according to claim 11,
wherein the nitrogen concentration of the upper surface portion of said upper silicon oxide film is 5 to 6 atom %.

13. The semiconductor device according to claim 8,
wherein said field-effect transistor further includes an assist gate formed on a third insulating film on said substrate, and said floating gate covering a part of said assist gate is formed on a fourth insulating film formed on an upper surface of said assist gate and on a fifth insulating film formed on a sidewall of said assist gate.

14. The semiconductor device according to claim 13,
wherein said second insulating film is formed of the upper silicon oxide film, and the nitrogen concentration of the upper surface portion of said upper silicon oxide film is equal to or lower than 10 atom %.

15. The semiconductor device according to claim 13,
wherein said second insulating film is formed of the upper silicon oxide film, and the nitrogen concentration of the upper surface portion of said upper silicon oxide film is 5 to 6 atom %.

16. The semiconductor device according to claim 13,
wherein said upper silicon oxide film is formed on a multilayer film obtained by sequentially depositing a lower silicon oxide film and a silicon nitride film, and the nitrogen concentration of the upper surface portion of said upper silicon oxide film is equal to or lower than 10 atom %.

17. The semiconductor device according to claim 13,
wherein said upper silicon oxide film is formed on a multilayer film obtained by sequentially depositing a lower silicon oxide film and a silicon nitride film, and the nitrogen concentration of the upper surface portion of said upper silicon oxide film is 5 to 6 atom %.

18. The semiconductor device according to claim 4, wherein the nitrogen concentration of the upper surface portion of said silicon oxide film formed on the multilayer film is equal to or lower than 10 atom %.

19. The semiconductor device according to claim 11, wherein the nitrogen concentration of the upper surface portion of said upper silicon oxide film is equal to or lower than 10 atom %.

* * * * *